(12) United States Patent
Hadidi

(10) Patent No.: US 6,346,899 B1
(45) Date of Patent: Feb. 12, 2002

(54) ANALOG CURRENT MODE D/A CONVERTER USING TRANSCONDUCTORS

(75) Inventor: Khayrollah Hadidi, Kamakura (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 09/453,551

(22) Filed: Dec. 3, 1999

(30) Foreign Application Priority Data

Dec. 4, 1998 (JP) ............................................. 10-345636

(51) Int. Cl.$^7$ ........................... H03M 1/66; H02M 11/00
(52) U.S. Cl. ....................................... 341/144; 327/103
(58) Field of Search ................................. 327/553, 103, 327/563; 341/143, 144, 145; 323/312; 330/253

(56) References Cited

U.S. PATENT DOCUMENTS

| | | | |
|---|---|---|---|
| 4,482,887 A | * 11/1984 | Crauwels | 341/133 |
| 5,289,136 A | 2/1994 | DeVeirman et al. | |
| 5,489,904 A | 2/1996 | Hadidi | |
| 5,510,738 A | * 4/1996 | Gorecki et al. | 327/103 |
| 5,801,655 A | 9/1998 | Imamura | |
| 5,912,583 A | * 6/1999 | Pierson et al. | 327/553 |
| 6,140,867 A | * 10/2000 | De Micheli et al. | 327/553 |
| 6,271,688 B1 | * 8/2001 | Marchese et al. | 327/65 |

FOREIGN PATENT DOCUMENTS

| | | |
|---|---|---|
| EP | 0 558 243 | 1/1993 |
| EP | 0 607 971 A2 | 7/1994 |
| GB | 2 164 511 | 3/1986 |
| JP | 9-232961 | 9/1997 |

* cited by examiner

*Primary Examiner*—Patrick Wamsley
(74) *Attorney, Agent, or Firm*—Finnegan, Henderson, Farabow, Garrett & Dunner, L.L.P.

(57) ABSTRACT

To provide a high-speed, high-resolution current mode D/A converter, the present invention provides: (1) a current mode D/A converter comprising a resistor-type D/A converter circuit 2 having a digital decoder circuit 3, a plurality of resistors 5, and a plurality of switches turned on and off by the digital decoder circuit 3 and a highly linear transconductor 4 for receiving voltage output from the resistor-type D/A converter circuit 2 and providing current output; and (2) a transconductor comprising a first transistor differential pair and a second transistor differential pair connected to each other with their polarities reverse and having different transconductance values and current sources connected to the first and second transistor differential pairs respectively, wherein different signal voltages being proportional to input signal voltages input to the transconductor are applied to the first and second transistor differential pairs.

17 Claims, 7 Drawing Sheets

F I G. 1
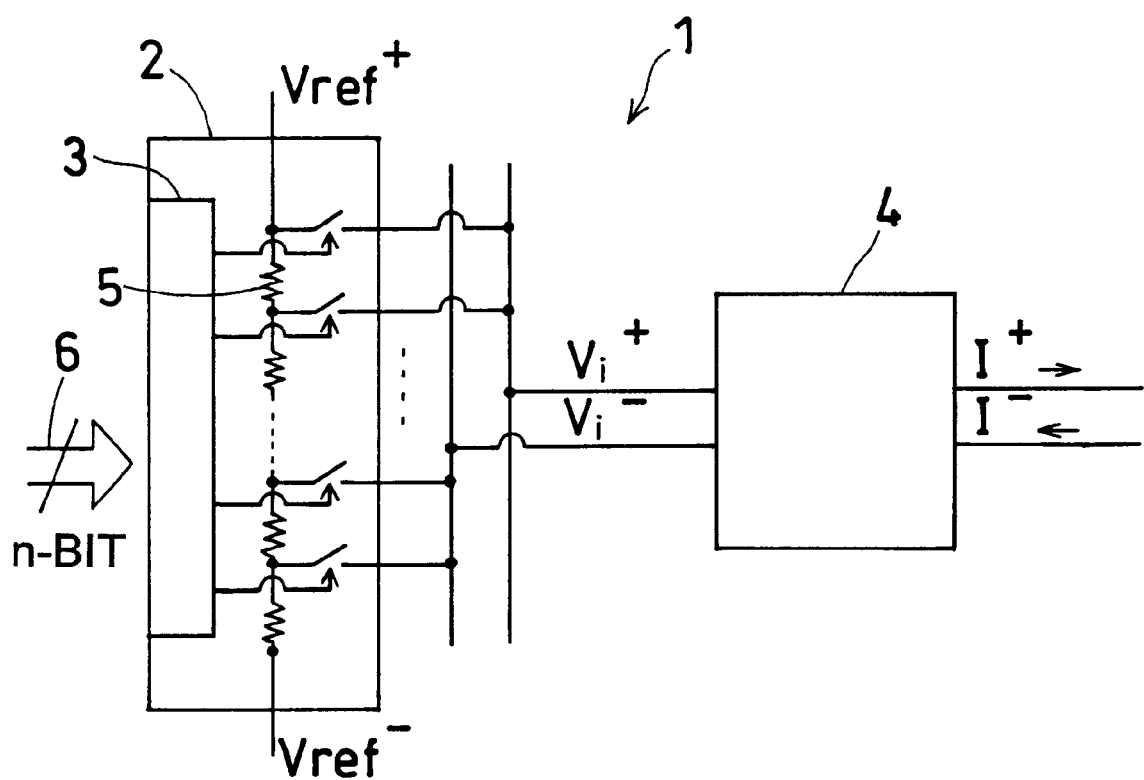

ANALOG CURRENT MODE D/A CONVERTER USING TRANSCONDUCTORS

BACKGROUND OF THE INVENTION

1. Field of the Invention

This invention relates to high-speed, high-resolution current mode D/A converters (DACs) converting digital signals into analog signals.

2. Description of the Related Art

Conventional high-speed current mode D/A converters (DACs) of binary switched current mode type, segmented type, and combination type of the two are known. DACs of the binary switched type include many unit current cells. The unit current cell are grouped to sets of a single cell, two cells, four cells, . . . $2^{n-1}$ cells. The current cells in each group turn on or off together. When an n-bit input digital word is processed, according to the value of each bit in the digital word, the corresponding groups of current cells turn on or off. An output current is usually supplied to a resistor having a small resistance of 50 or 75 ohms, generating the corresponding output voltage. FIG. 6 shows a simplified diagram for such a DAC.

In FIG. 6, a first group 101 comprises one current cell, a second group 102 two current cells, a third group 103 four current cells, and so on. That is to say, the number of current cells in each group doubles moving from one group to the next group. Each of switches $S_1$, $S_2$, $S_3$, . . . sends current from the corresponding current cell group to output. Each of switches $S_1'$, $S_2'$, $S_3'$, . . . connects the same group to the ground so that it will not take time to return to normal operating conditions after forcing current sources to turn completely off. The switches are also split into groups 111, 112, 113, etc. Each group includes a pair of switches. These switch groups correspond to the current cell groups. When $S_1$ is on, LSB (Least Significant Bit) is 1; when $S_2$ is on, the second LSB is 1; when $S_3$ is on, the third LSB is 1. Similarly, when $S_n$ is on, MSB (Most Significant Bit) is 1; when $S_{n-1}$ is on, the second MSB is 1.

Such a current mode DAC has the disadvantage of difficult matching the currents from groups of current cells with binary weights. A 10-bit DAC would need 1,023 unit current cells. Each group can be viewed as a differential pair called a current steering cell.

While such a DAC has the advantage of very simple logic circuit structure, it has the disadvantages of large glitches which are noise signals occurring at the time of switching, and significant non-linearity caused by mismatches among binary sets of current cells. Such a system is often called a "binary current mode DAC."

Other circuits called "segmented current mode DACs" are known. The advantage of this type of DACs over the conventional one is considerably improved linearity and a significantly smaller glitch power. Circuits of this type also comprise many unit current cells. These unit current cells 121 comprise a combination of a current source and two switches. One circuit shown in FIG. 7 is a single-ended single current cell 121 and corresponds to one digital signal. The circuit shown can be considered to be one for LSB directly corresponding to the digital signal. In such a segmented current mode DAC, the unit current cells 121 are turned on and off one by one, not as a group. An input n-bit data signal is converted into $2^n-1$ digital signals by a logic circuit. Individual digital signals generated as a result of this conversion turn the unit current cells on and off. This decoder logic circuit for converting an n-bit signal into $2^n-1$ signals covers a very large hardware area and consumes a large amount of power.

In a high-resolution DAC having a large value of n, therefore, circuits of the above binary current cells and segmented type are usually combined to reduce the size of the required hardware. However, this compromises accuracy and enlarges signal glitches. Moreover, many unit current cells are used, and so there have been the problems of complex circuit layout and need for large areas.

These problems with the conventional art arose chiefly from turning on and off current cells discontinuously. In other words, conventional current mode DACs have had the problem of 100% of an electric current from current cells being sent either to an output or to the other output in the case of differential type DACs (or to the ground for single-ended DACs). Therefore, a current cell or a differential pair in each current cell will receive very strong signals at its input and be exposed to large current fluctuations at the "common source" point of differential pairs, resulting in large glitches and significant non-linearity.

THE SUMMARY OF THE INVENTION

An object of the present invention is to provide a new circuit structure in order to resolve the above problems.

The present invention provides a high-speed current mode DAC comprising a combination of a resistor-type DAC circuit including a digital decoder circuit and a highly linear transconductor.

In a current mode DAC according to the present invention, differential pairs or transconductors are not turned on or off completely. That is to say, the present invention makes active use of several transconductor states in a predetermined range. In the whole range of input, individual differential pairs can take any of states distributed discretely from one end of the range to the other end of the range. In this limited sense the current mode DAC according to the present invention adopts an analog-like approach. Moreover, fluctuations in the voltage input to each transconductor are relatively small, resulting in a significant reduction of glitches in question.

The present invention also provides a novel highly linear transconductor. This transconductor has high linearity by making use of two differential pairs each one of which does not necessarily have high linearity or linearity comparable to that of the resulting transconductor.

More specifically, the present invention provides: (1) a current mode D/A converter comprising a resistor-type D/A converter circuit having a digital decoder circuit which accepts a digital input signal, a plurality of series-connected resistors of which nodes are connected to a plurality of output terminals of the resistor-type D/A converter circuit through a plurality of switches which are turned on and off according to outputs from the digital decoder circuit; and a highly linear transconductor for receiving a voltage output from the resistor-type D/A converter circuit and providing an analog current output; (2) a transconductor comprising a first MOS transistor differential pair and a second MOS transistor differential pair connected in parallel to each other at their outputs with their polarities of input voltages reversed and having different transconductance values and different current sources connected to the first and second transistor differential pairs respectively, wherein signal voltages which are proportional to input digital signal voltages but have different values are applied to the first and second transistor differential pairs; and (3) a current mode D/A converter described in (1) which uses the transconductor described in (2) above.

Such transconductors can be manufactured using either of the bipolar or CMOS technology. When actually implemented, MOS transistors are preferably used. The first differential pair can preferably be formed by combining a plurality of differential pairs each of which can have the same parametric characteristics as those of the second differential pair. When the first differential pair is formed of a plurality of differential pairs which have the same parametric characteristics as the second pair and which are connected in parallel with each other, matching would be considerably facilitated, resulting in smaller errors.

Also, one resistor-type D/A converter circuit and a plurality of transconductors may be included in the current mode D/A converter of the present invention. In this preferred case, the single resistor-type D/A converter circuit can include a k-bit resistor-type D/A circuit to process a n-bit digital signal, where n is more than k. This is made possible, for example for a 12-bit digital signal, by using different portions of a single 7-bit resistor-type DAC circuit.

Furthermore, a plurality of [one] resistor-type D/A converter circuits and a plurality of transconductors may be included in the current mode D/A converter of the present invention. These resistor-type D/A converter circuits and transconductors form a plurality of pairs and each of these pairs can perform D/A conversion on a plurality of bits included in an n-bit digital signal input. For example, a 10-bit input would be divided in two (5 bits per pair), a 12-bit input in three (4 bits per pair), and a 15-bit input in three (5 bits per pair), or any other combinations.

In the above transconductor, the ratio of transconductance of the first MOS transistor differential pair to that of the second MOS transistor differential pair may be substantially eight to one, and the ratio of a signal voltage input to the first MOS transistor differential pair to the input to the second MOS transistor differential pair may be substantially one to two. In this case, the capacity of the current source connected to the first transistor differential pair may be eight times that of the current source connected to the second transistor differential pair. Preferably, the current source for the first pair may be formed of eight current sources each of which has the same characteristics as those of the current source for the second transistor differential pair and which are connected in parallel with each other, just like the first differential pair in the transconductor can be formed of several transistor pairs in which each transistor has the same parametric characteristics as those used in the second differential pair as discussed above. Again, matching would be easier if the same unit transistors are used to form current sources of differing capacities.

BRIEF DESCRIPTION OF THE DRAWINGS

FIG. 1 shows a current mode D/A converter according to an embodiment of the present invention in a simplified way.

DETAILED DESCRIPTION OF THE INVENTION

As shown in FIG. 1, a basic embodiment of a current mode DAC 1 according to the present invention comprises a resistor-type DAC circuit 2 including a digital decoder circuit 3, and a highly linear transconductor 4. When an n-bit digital signal is input from the left, the n-bit digital decoder circuit 3 selects one of $2^n$ pairs of switches in response to the input signal. The digital decoder circuit 3 used here is well known to a person skilled in the art, and therefore it will not be described here. When one of the $2^n$ sets of switches is turned on (since differential pairs are formed, two switches are needed for each pair), output voltages corresponding to one of $2^n$ differential voltages in the range of $(V_{ref}^+ - V_{ref}^-)$ to $(V_{ref}^- - V_{ref}^+)$ are output from the resistor-type DAC circuit 2 through $2^n$ resistors 5 of the same size connected in series. These output voltages are converted to current output by the highly linear transconductor 4, of which details will be described below. Only four switches and four resistors are shown in FIG. 1 for the sake of simplicity, but actually the number of switches and resistors included are $2^n$.

Figure 2:
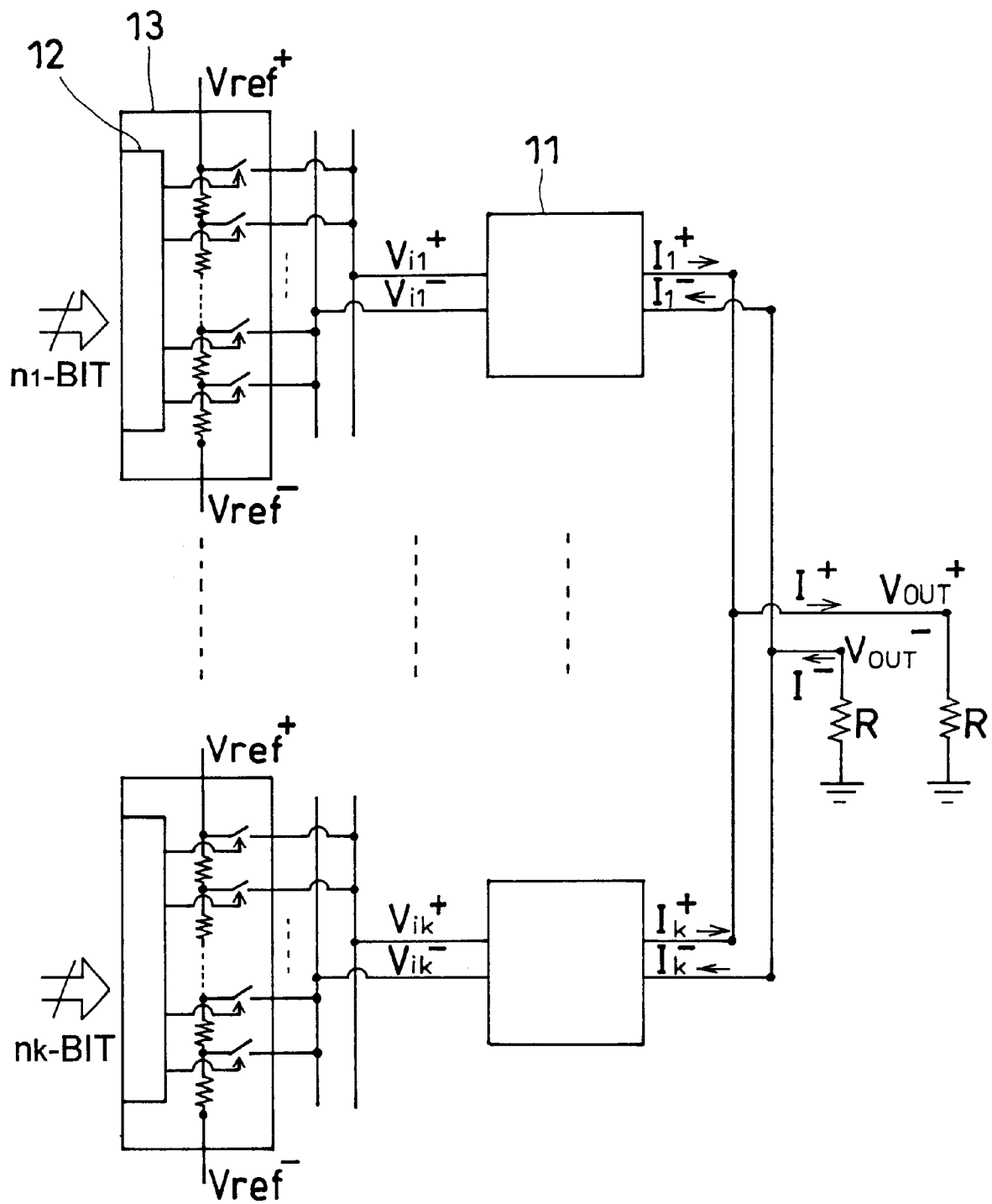
FIG. 2 shows the circuit structure of a current mode D/A converter according to another embodiment of the present invention in which k resistor-type DACs and k transconductors are combined.

In FIG. 2, an embodiment of the present invention preferable for a high-resolution DAC that has a relatively large number of input bits is shown. This DAC has k highly linear transconductors 11. The structure of the transconductors 11 will be detailed below. Each transconductor 11 can convert an analog input voltage into a differential current with high linearity. This differential current $(I_m^+ - I_m^-)$ (m=1, ..., k) is proportional to a value of the corresponding input bit. The output of a resistor-type DAC circuit 13, including a digital decoder circuit 12 to which a digital signal is input, is connected to the input of this transconductor 11 through switches.

If a single transconductor is used in an n-bit DAC, a digital decoder will need $2^n$ outputs for controlling $2 \times 2^n$ switches. If n is 10, 1,024 signals and 2,048 switches are necessary. This will not be realistic in terms of the amount of hardware required. An even greater problem is the size of a resistor array. For example, if n is 10, 1,024 unit pieces of resistors are necessary. Apart from the problem of the amount of hardware, such an increase in the number of resistors in the resistor array may lead to a fatal degradation of linearity.

Therefore, n bits are divided into a plurality of groups, in an arbitrary manner depending on trade off among linearity and hardware, and a combination of transconductors and resistor-type DAC circuits suitable for each group is used. In FIG. 2, $n = n_1 + n_2 + \ldots + n_k$ for an n-bit signal input.

Figure 3:
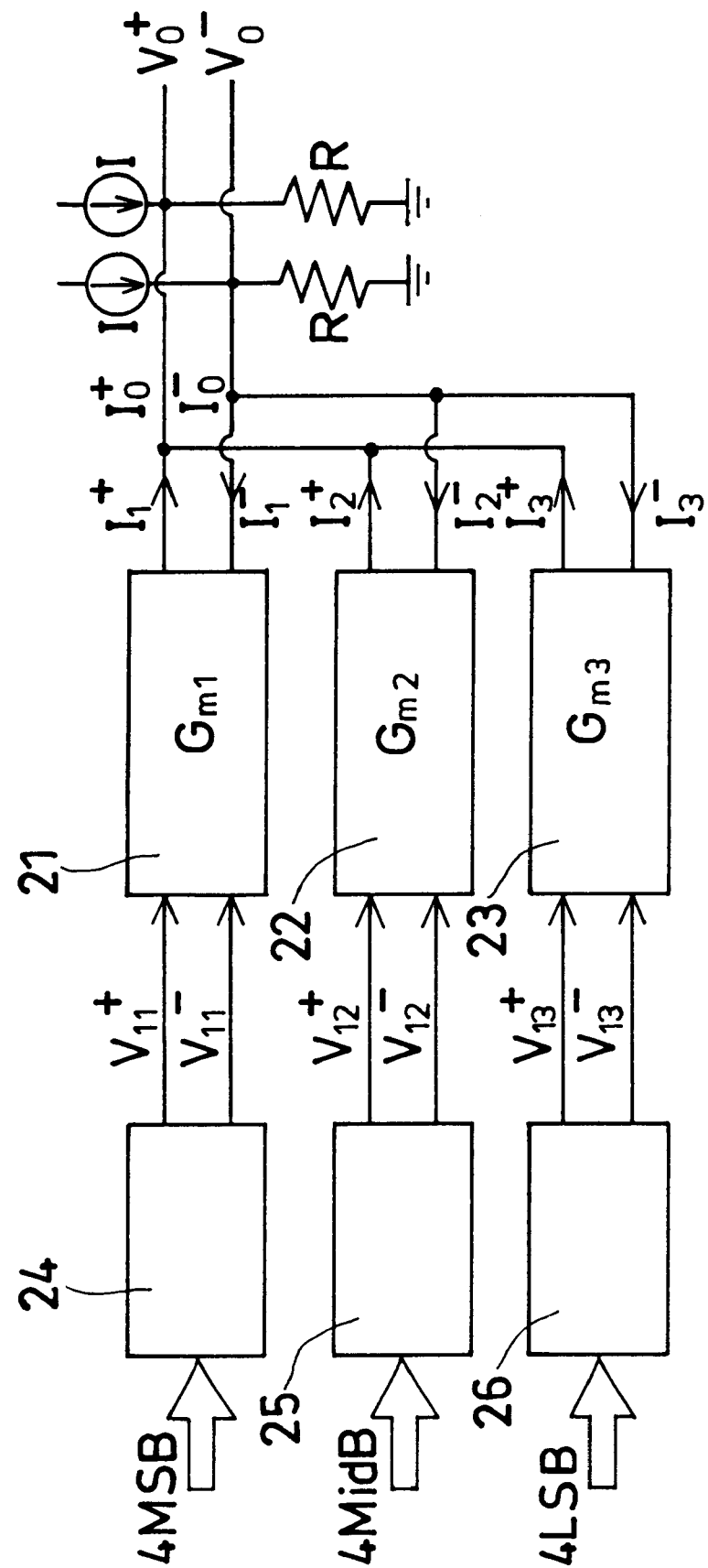
FIG. 3 is a block diagram of a current mode D/A converter according to an embodiment of the present invention.

According to the present invention, a plurality of transconductors can be used in, for example, a 12-bit DAC. In an example shown in FIG. 3, three transconductors 21, 22, and 23 are used (k=3). In this case, each transconductor converts a 4-bit data signal into one differential signal. As shown in FIG. 3, a 12-bit data signal input is divided into signals of four most significant bits (MSB), four middle significant bits (MidB), and four least significant bits (LSB), and each 4-bit signal is eventually converted into an analog output by one transconductor. As a result, only sixteen resistors are used in the resistor array for each of three resistor-type DAC circuits 24, 25, and 26, and so the number of switches can be reduced to 32 for each sub converter.

Therefore, the above output differential current $\Delta I_1 = I_1^+ - I_1^-$ is proportional to a value of these four most significant bits and an output differential current for the next four bits is given by $\Delta I_2 = I_2^+ - I_2^-$. It is the same with the third four bits. High linearity of this transconductor described below will ensure the matching of four bits for which the same transconductor is used. In fact, the matching of resistors will be the limiting factor for the linearity. Thus, increasing the number of bits on upper transconductors enhances linearity.

In this case, if all transconductors have the same transconductance ($G_{m1} = G_{m2} = G_{m3}$), either $2^{12}$ pieces of resistor-type DACs and corresponding digital decoder circuits are needed or resistor-type DAC circuits would have to have different reference voltages $V_{ref}^+$'s and $V_{ref}^-$'s. It is nearly impossible to generate different $V_{ref}^+$ and $V_{ref}^-$ voltages with required accuracy. If different $V_{ref}^+$ and $V_{ref}^-$ could be generated, and several resistor-type DAC circuits including $2^4$ (=16) resistors are used, the size of each circuit will be much smaller than that needed to use a resistor-type DAC circuit including $2^{12}$ (=4096) resistors. Therefore, different $G_m$ values are used according to the present invention. For example, the combination of $G_{m1} = 4G_{m2} = 32G_{m3}$ have been used. Of course designers can select any other numbers of transconductors, transconductance ratios, sizes of digital decoder circuits, etc. as necessary, but the above selection of $G_m$ values are preferable on the basis of ease of implementation and optimum amount of hardware.

If the total output differential current is $\Delta I$, then $\Delta I$ is given by:

$$\Delta I = \Delta I_1 + \Delta I_2 + \Delta I_3 =$$

$$\sum_{i=1}^{4} V_{ref} G_{m1} 2^{-i} + \sum_{j=1}^{4} ((1/4)V_{ref})G_{m2} 2^{-j} + \sum_{k=1}^{4} ((1/8)V_{ref})G_{m3} 2^{-k}$$

Considering the relationship of $G_{m1} = 4G_{m2} = 32G_{m3}$, this expression can be simplified as follows:

$$\Delta I = \sum_{i=1}^{12} V_{ref} G_{m1} 2^{-i}$$

This is a rigorous expression for a 12-bit current mode DAC.

This relationship will be considered further. The three 4-bit resistor-type DAC circuits can be combined, and so it equals the use of different portions of a 7-bit resistor-type DAC circuit. Given that $G_{m1} = 32G_{m3}$ as in the above, the ratio of the maximum transconductance to the minimum transconductance is 32 (=$2^5$) to 1. The size of a resistor array in the resistor-type DAC circuits can therefore be reduced from 4,096 to 128 (=$2^7$). Of the 128 outputs from the 7-bit resistor-type DAC, we can then use the consecutive 16 outputs in the middle of the resistor chain (taps 56 to 72) for $G_{m3}$, every fourth outputs in the middle of the resistor chain (taps 32 to 96) up to 64th output for $G_{m2}$, both main and auxiliary pairs (the number of outputs to be used is 16), and 16 every eighth outputs for $G_{m1}$ the same taps for the main pair of $G_{m3}$ and every other tap (taps 48 to 80) for auxiliary pair of $G_{m3}$, every fourth taps (taps 32 to 96) for the main pair of $G_{m1}$ and every eighth tap (taps 1 to 128) for the auxiliary pair of $G_{m1}$. Thus resistor-type DACs can be scaled and combined. For the 12-bit input, three resistor-type DACs 24, 25, 26 shown in FIG. 3 can be replaced by one 7-bit resistor-type DAC circuit 27 as shown in FIG. 4.

Note that a circuit having a resistor array of 4,096 resistors is next to unfeasible as a practical option in terms of size. However, a circuit having an array of 128 resistors can be produced with relative ease, and the linearity and matching will be improved considerably in comparison with such a resistor array of large sizes as those having 4096 resistors. The same consideration will apply to switches and other logic circuits.

Further, as will be described below, two voltages (having a two-to-one voltage ratio in the following embodiment) are used in a transconductor which comprises two transconductor circuits (differential pairs) with two different sets of parameters. The above 7 bits should therefore be increased to 8 bits with one bit added due to larger voltages ($V_B^+$ and $V_B^-$ in FIG. 5) the auxiliary pair used in the transconductor requires. With a transconductor having the smallest transconductance, however, it is known that the differential application of input voltages may be safely omitted (that is, in every step, voltage to only one side of differential pair is changed), and so 7 bits, or 128 resistors, can be used with this one bit being omitted.

Figure 4:
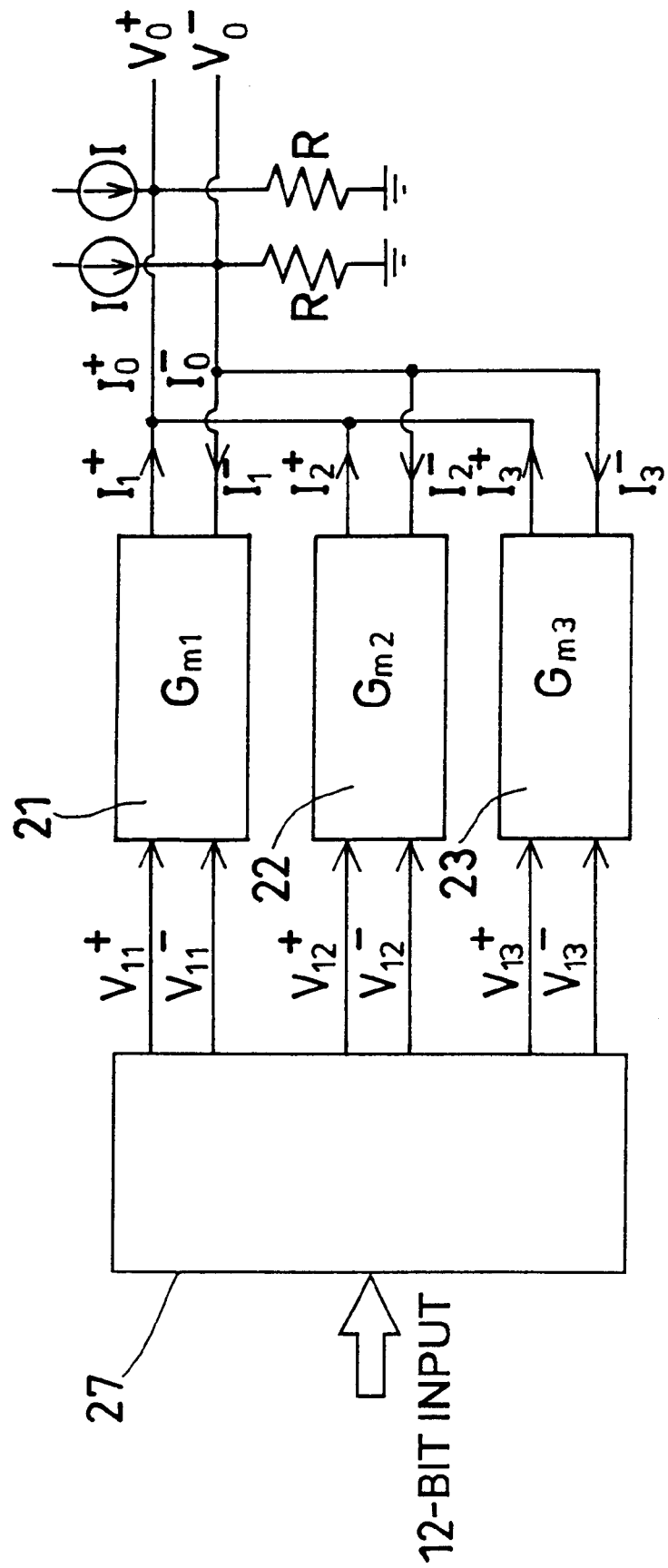
FIG. 4 is a block diagram of a current mode D/A converter according to another embodiment of the present invention which comprises three transconductors and one 7 bit resistor DAC which is functionally equivalent to the three 4-bit DACs shown in FIG. 3.

In the embodiment shown in FIG. 4, the single resistor-type DAC circuit 27 including 128 resistors and ($2 \times 2 \times 16) \times 3$ (=192) switches, and three transconductors 21, 22, 23 are used.

The number of switches is calculated as follows. In a transconductor according to the present invention described below, two transconductor circuits (which need not be very highly linear) are combined to obtain high linearity. These two transconductor circuits are called the main transconductor circuit and the auxiliary transconductor circuit. Two switches are used for each state of the transconductor circuits due to their differential structure; there are two transconductors in each combined linear transconductor circuits; and there are sixteen states for each side of each transconductor. Thus each linear transconductor requires 64 switches. These switches exist for each of the three transconductors, and so the number of switches triples; that is to say, the total is 192 switches.

With a DAC according to the present invention, therefore, the amount of hardware can be reduced dramatically, linearity is improved, the amount of necessary power decreases, and the response speed increases. A transconductor will never be turned off completely, making quick responses to input signals possible.

$G_m$ ratios, the number of resistors, the number of switches, and so on described above can be and should be selected freely under various conditions and are never limited to the above example. When the number of input bits are given, designers should arbitrarily select, in accordance with the purpose of circuits, the number of transconductors, transconductance ratios, and other circuit parameters corresponding to them, with various factors taken into consideration.

Next, a highly linear transconductor according to the present invention will be described. It is difficult and complex to make a linear CMOS transconductor according to conventional methods. Moreover, such a transconductor uses feedback, often resulting in slow responses.

The design of a transconductor according to the present invention is based on a simple mathematical concept so that it can operate linearly. It can be designed using a resistor circuit. For example, when $\Delta V_{in}$ is input to a first pair (main pair), a differential voltage of $2\Delta V_{in}$ can be input to a second pair (auxiliary pair). A ratio of exactly one to two can be produced easily by simply applying the output of a digital decoder to two different sets of switches, one set connected to resistor taps consecutively and the other to every other tap of the above resistor-type DAC circuit. Notice that this DAC needs $2\times2^n$ resistors. An arbitrary value can be used for this ratio, that is to say, an integer, such as three or four. However, the simplest number of two is effective in simplifying the structure of a resistor circuit for dividing input voltages and is therefore preferable.

Figure 5:
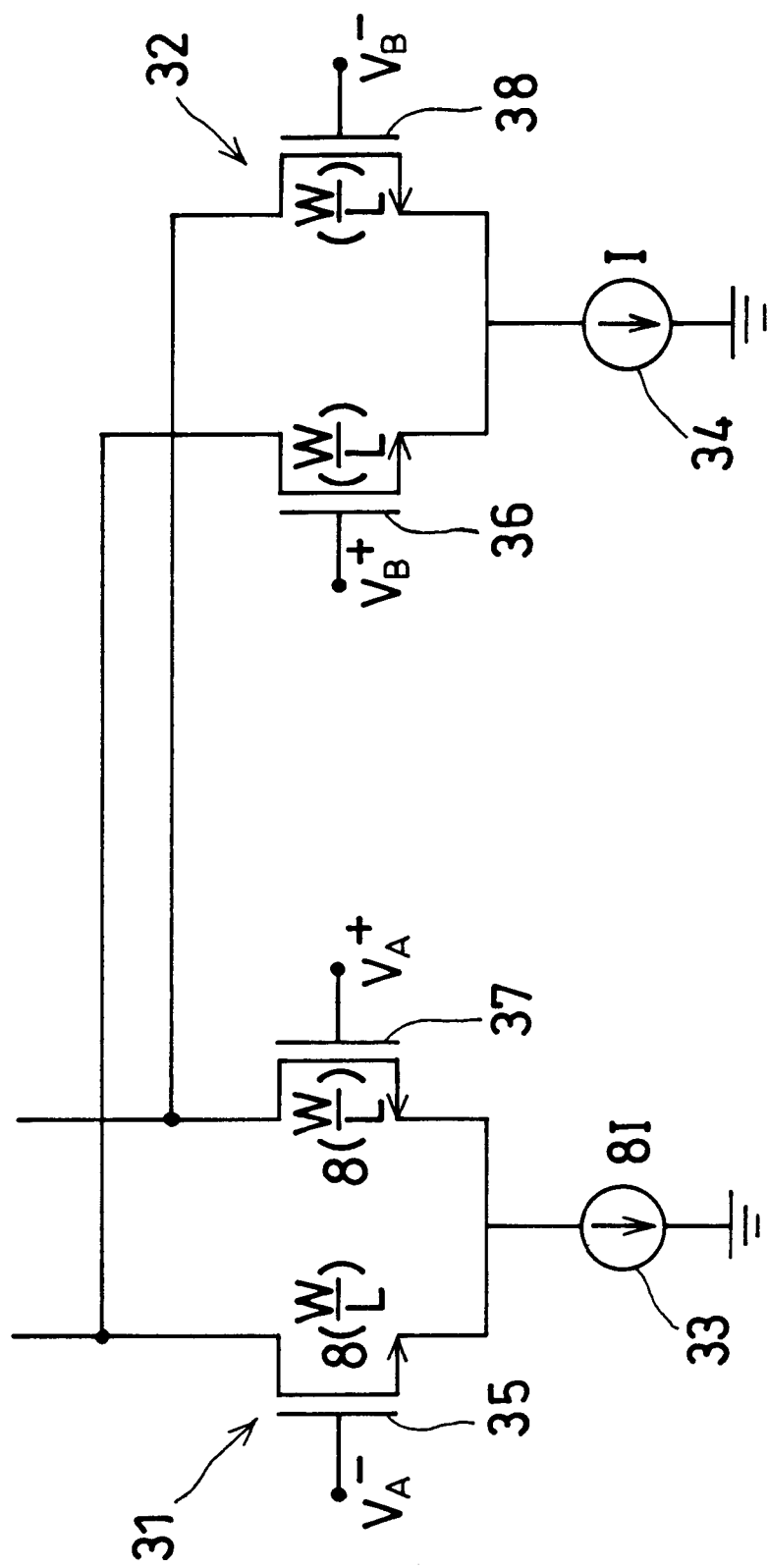
FIG. 5 is a simplified diagram showing an embodiment of a transconductor according to the present invention.
Figure 6:
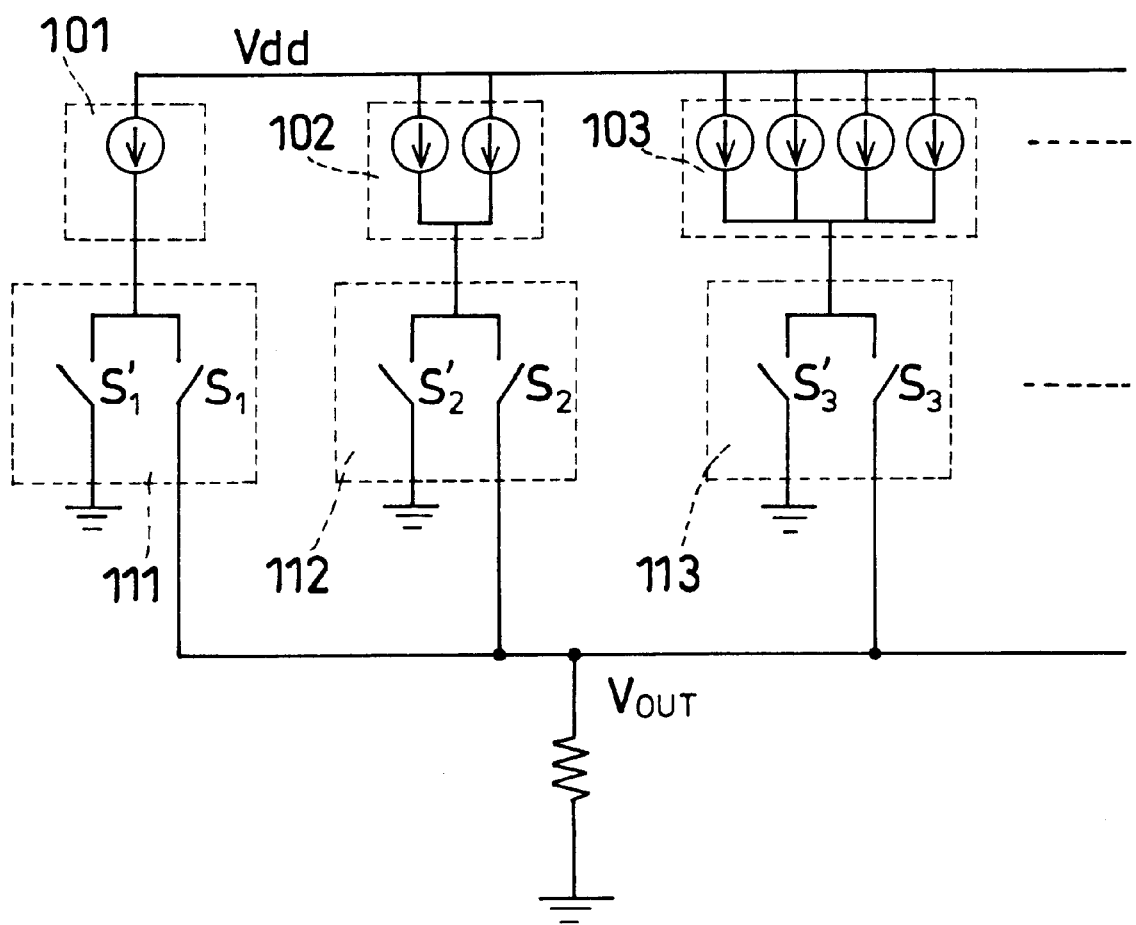
FIG. 6 is a circuit diagram showing the principle of a conventional single-ended binary-type D/A converter.
Figure 7:
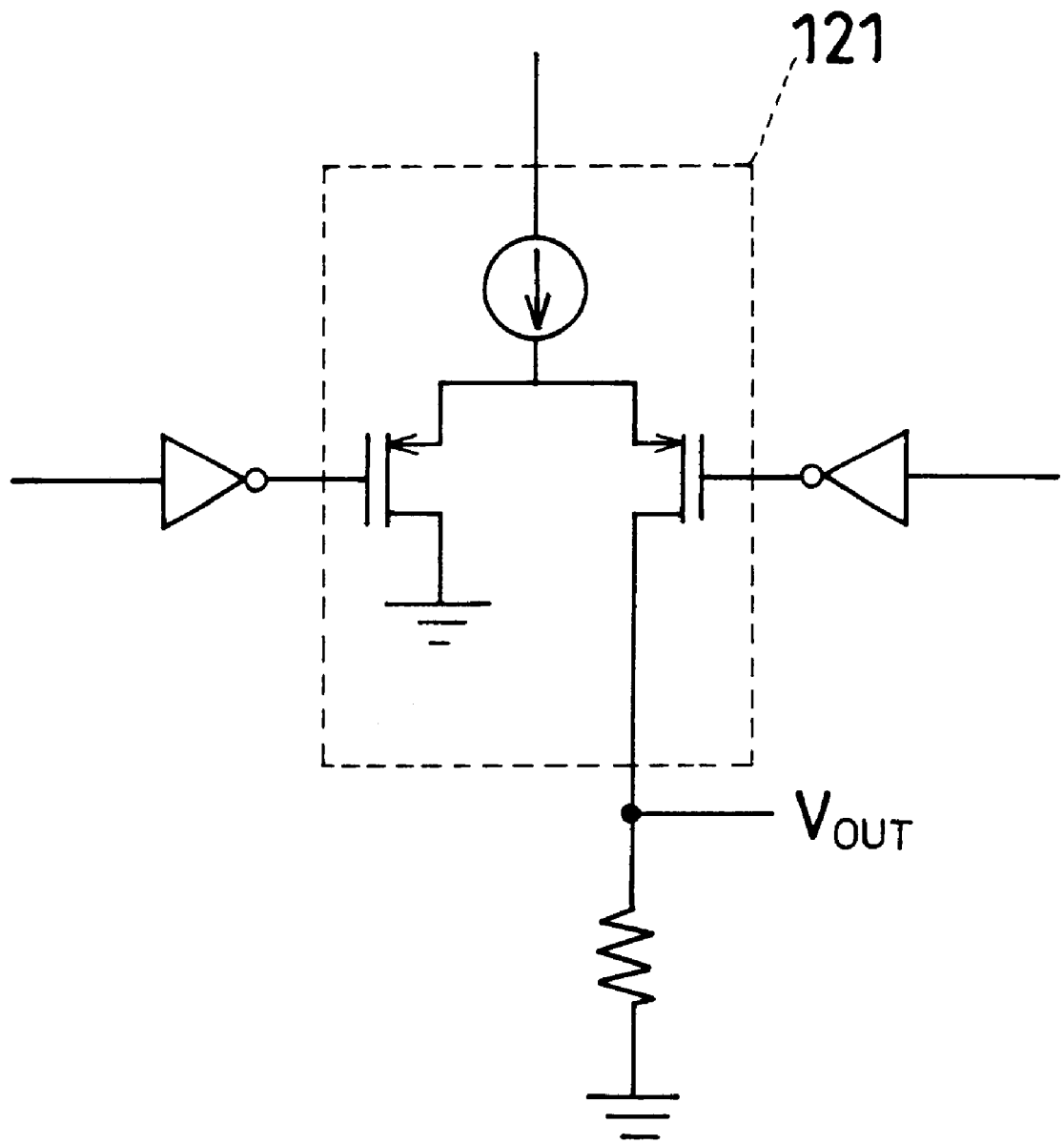
FIG. 7 is a circuit diagram showing the principle of a conventional single-ended binary-type D/A converter.

An example of the structure of a transconductor according to the present invention is shown in FIG. 5. In FIG. 5, the ratio of voltages applied to two transconductor circuits is two, as described above, or $2(V_A^+ - V_A^-) = V_B^+ - V_B^-$, where $V_A^+$ and $V_A^-$ are voltages applied to the main transconductor circuit, and $V_B^+$ and $V_B^-$ are those for auxiliary transconductor circuit. This can be achieved easily by a resistor circuit (not shown). It should be first noted, in FIG. 5 that the two differential pairs 31 and 32 are connected to each other with their polarities reversed. In the first differential pair 31, for example, the drain of a transistor 35 to which $V_A^-$ of certain polarity is applied is connected to the drain of a transistor 36 to which $V_B^+$ of reversed polarity is applied. The same applies to transistors 37 and 38.

The transconductance ratio between a pair of MOS transconductor circuits 31 and 32 is 8(W/L) to W/L, or eight to one, where W is the channel width of a transistor and L is the channel length of a transistor. So the capacity ratio of a current source connected to the first differential pair 31 to a current source connected to the second differential pair 32 is eight to one, which is the same as the transconductance ratio. When implemented in actual MOS circuit designs, the transconductor circuit 31 is preferably realized by connecting in parallel eight transconductor circuits having a size of W/L. This is because using the same unit differential pairs for the two transconductor circuits, matching will be significantly improved. The above transconductance ratio can be selected in the following way.

When the large signal Gm of a differential transconductor is expanded, $G_m$ is a function of input signal $\Delta V$. Differential transconductor circuits operate in a differential manner for $\Delta V$, and so a term of $\Delta V$ to the power of odd numbers is not included in the expansion of Gm in terms of $\Delta V$.

Therefore, $G_m = g_{mo}(1 + a_3 \Delta V^2 + a_5 \Delta V^4 + \ldots)$ wherein $g_{mo}$ is the small signal transconductance. For a given linear transconductor described above, $$\Delta I_{out}^{total} = G_m^P \Delta V - 2G_m^n \Delta V$$

This equation reflects the fact that the resistor-type DAC is made so that when $\Delta V_{in}$ is input to the first differential pair, a voltage of $2\Delta V_{in}$ is applied to the second differential pair, as described above. Moreover, the first and second differential pairs are connected to each other with their polarities reversed, as shown in FIG. 5. As a result, the total current is given by the difference between the current running through the first differential pair and that running through the second differential pair.

$G_m^{total}$ therefore is given by:

$$G_m^{total} = G_m^P - 2G_m^n$$

where $G_m^P$ is transconductance of the first differential pair and $G_m^n$ is transconductance of the second differential pair. That is to say, superscript "p" represents the main differential pair; superscript "n" represents the auxiliary differential pair.

In addition, if $g_{mo}^P = 8 g_{mo}^n$ or $g_{mo}^n = g_{mo}^P/8$, then $$G_m^{total} = g_{mo}^P(1 + a_3 \Delta V^2 + a_5 \Delta V^4 + \ldots)$$

$$-2g_{mo}^P/8(1 + a_3(2\Delta V)^2 + a_5(2\Delta V)^4 + \ldots)$$

$$= 3g_{mo}^P/4(1 - 3a_5(\Delta V)^4 - 15a_7(\Delta V)^6 \ldots)$$

$$\approx 3g_{mo}^P/4$$

and $$\Delta I^{total} = G_m^{total} \Delta V = 3g_{mo}^P/4(\Delta V - 3a_5(\Delta V)^5 - 15a_7(\Delta V)^7 \ldots)$$

$$\approx 3/4 g_{mo}^P \Delta V$$

We have arrived at a term which is independent of $\Delta V$ and fixed. Since the terms involving $a_3$ cancel each other, and $a_5$ is usually extremely small so that the term involving $a_5$, $a_7$, and so on can be ignored, the approximation in the above equation is good. Total $G_m$ is now reduced to three-quarters of $g_{mo}^P$, meaning that efficiency has been sacrificed slightly for linearity. It should be noted that the effects of even harmonics are cancelled due to differential structure and the effects of the third harmonic are cancelled completely. Again, fifth harmonic and higher odd harmonics are much weaker than the third harmonic and can be neglected practically. A circuit serving as a highly linear transconductor even for strong input signals can therefore be made by using a simple value of $G_m^P/G_m^n = 8$. If the effects of the fifth harmonic is also needed to be cancelled, equations should be solved for each of the ratio of voltages input to the first and second differential pairs (set to one to two in the above example) and the ratio of $g_m^n$ to $g_m^P$ (set to one to eight in the above example) as variables, under conditions which will cancel a term on the fifth harmonic. This will provide a value for each of these variables. If these values are used, the effects of the fifth harmonic can also be cancelled. This will result in higher linearity but also in a more complex circuit structure.

In an embodiment of the present invention, these transconductors can preferably be made using unit circuits consisting of a differential pair. Such use of unit circuits makes it possible to match Gm ratios more accurately in actual circuit designs. Eight unit circuits for the main transconductor circuit plus one unit circuit for the auxiliary transconductor circuit are used in a second transconductor ($G_{m2}$); thirty-two unit circuits for the main and eight for the auxiliary are used in a first transconductor ($G_{m1}$); and one unit circuit for the main and one-eighth unit circuit for the auxiliary are used in a third transconductor ($Gm_3$) which is the smallest and corresponds to LSB bits (in this case, 4 bits). One unit circuit, for example, comprises a transistor pair which acts as a unit transconductor and a unit current source. Such unit circuits are normally connected in parallel at both inputs and outputs. Compared with one unit circuit, one-eighth unit circuit is difficult to make and often do not have accurate parametric values. As a matter of fact, however, no significant problems arise from the use of the one-eighth circuit because it is used only for LSB. This is merely a simplification for ease of designing and manufacturing circuits. Therefore, if higher accuracy is needed or other conditions are met, any number of unit circuits may be used or unit circuits do not have to be used so long as predetermined transconductance ratios can be achieved.

A circuit according to the above embodiment of the present invention was actually made using the conventional 0.6 $\mu$m digital CMOS technology. The number of input bits was twelve. These input bits were divided into three groups and a resistor-type DAC circuit, and one transconductor were used for each group. An area of 0.72 mm$^2$ was needed for the circuit according to the present invention; the driving voltage was 5 V; the amount of power consumed was 350 mW; the integral non-linearity (INL) was ±2 LSB; the differential non-linearity (DNL) was ±1 LSB. The circuit operated in data through mode even at a clock rate of 400

MHz. Tektronix 2030 (8-channel pattern generator) having the shortest rise and fall time of 2.9 nanoseconds was used. The measurement performed with 4-bit LSB grounded yielded THD of −54 dB, which is a nearly ideal result for an 8-bit DAC. Tektronix 2040 (2-channel pattern generator) was used for a clock.

What is claimed is:

1. A current mode D/A converter comprising:
    a resistor-type D/A converter circuit having a digital decoder circuit which accepts a digital input signal, a plurality of switches which are turned on and off according to outputs from the digital decoder circuit, and a plurality of series-connected resistors of which respective nodes are connected to output terminals of the resistor-type D/A converter circuit through the switches; and
    a highly linear transconductor for receiving a voltage output from the resistor-type D/A converter circuit and providing an analog current output,
    wherein the current mode D/A converter includes at least one resistor-type D/A converter circuit and a plurality of transconductors.

2. The current mode D/A converter according to claim 1, wherein the resistor-type D/A converter circuit outputs more than one output voltage each of which reflects a portion of digital bits included in the digital input signal.

3. The current mode D/A converter according to claim 1, wherein the current mode D/A converter includes a plurality of the resistor-type D/A converter circuits.

4. The current mode D/A converter according to claim 3, wherein the plurality of resistor-type D/A converter circuits and the plurality of transconductors form pairs, and each of the plurality of resistor-type D/A converter circuits performs D/A conversion on a portion of bits included in an n-bit digital signal input.

5. The current mode D/A converter of claim 1, wherein each of the plurality of the transconductors includes:
    a first MOS transistor differential pair and a second MOS transistor differential pair connected at output nodes with their input voltage polarities reversed and having different transconductance values, and
    different current sources connected to the first and second transistor differential pairs respectively, wherein signal voltages which are applied to the first and second differential pairs are proportional to a signal voltage input to the transconductor but have different values.

6. The current mode D/A converter according to claim 5, wherein a ratio of transconductance of the first transistor differential pair to transconductance of the second transistor differential pair is substantially eight to one, and a ratio of a signal voltage input to the first transistor differential pair to a signal voltage input to the second transistor differential pair is substantially one to two.

7. The current mode D/A converter of claim 1, wherein each of the plurality of the transconductors includes:
    a first MOS transistor differential pair with a device size of W/L, a current source value, and a first signal input voltage; and
    a plurality of other MOS transistor differential pairs with each pair having the same device size and current source value as the first MOS transistor differential pair and having a second input signal voltage, the second input voltage being half of the first signal input voltage, wherein the polarity of signal voltages input to the first MOS transistor differential pair and to the plurality of other MOS transistor differential pairs are reversed, such that the current signals of the first pair and the plurality of other transistor differential pairs are subtracted from each other.

8. A current mode D/A converter comprising:
    a combined-type MOS transconductor including
    a first MOS transistor differential pair and a second MOS transistor differential pair connected at output nodes with their input voltage polarities reversed and having different transconductance values, and
    different current sources connected to the first and second transistor differential pairs respectively, wherein signal voltages which are applied to the first and second differential pairs are proportional to a signal voltage input to the transconductor but have different values.

9. The current mode D/A converter according to claim 8, wherein a ratio of transconductance of the first transistor differential pair to transconductance of the second transistor differential pair is substantially eight to one, and a ratio of a signal voltage input to the first transistor differential pair to a signal voltage input to the second transistor differential pair is substantially one to two.

10. A current mode D/A converter comprising:
    a resistor-type D/A converter circuit having a digital decoder circuit which accepts an n-bit digital input signal wherein n is an integer, a plurality of switches which are turned on and off according to outputs from the digital decoder circuit, and a plurality of series-connected resistors of which respective nodes are connected to each output terminal of the digital decoder circuit through the switches; and
    at least one transconductor for receiving voltage output from the resistor-type D/A converter circuit and providing current output, the transconductor including
    a first MOS transistor differential pair and a second MOS transistor differential pair connected at output nodes with their input voltage polarities reversed and having different transconductance values, and
    different current sources connected to the first and second transistor differential pairs respectively, wherein signal voltages which are applied to the first and second differential pairs are proportional to a signal voltage input to the transconductor but have different values.

11. The current mode D/A converter according to claim 10, wherein n is twelve, the number of the resistor-type D/A converter is one and of 7-bit type, the resistor-type D/A converter has three sets of output voltages with a fixed ratio between values of each set of the outputs, and the number of the transconductors is three.

12. The current mode D/A converter according to claim 11, wherein each transconductor processes data corresponding to 4-bit data obtained by dividing the digital input signal.

13. The current mode D/A converter according to claim 11, wherein the resistor-type D/A converter has three sets of outputs corresponding to three sets of 4-bit data obtained by dividing the digital input signal, and the three combined-type MOS transconductors have an effective transconductance ratio of 32:8:1 and are respectively connected to each of the three sets of outputs from the resistor-type D/A converter circuit, where the ratio of values in each set of outputs from the resistor-type D/A converter circuit is two.

14. The current mode D/A converter according to claim 10, wherein the number of the resistor-type D/A converter circuit is one, and the number of transconductors, that of digital decoder circuits, and that of corresponding sets of the switches are at least two and are independent of each other.

15. The current mode D/A converter according to claim 10, wherein a ratio of transconductance of the first transistor differential pair to transconductance of the second transistor differential pair is substantially eight to one, and a ratio of a signal voltage input to the first transistor differential pair to a signal voltage input to the second transistor differential pair is substantially one to two.

16. A current mode D/A converter comprising:
a combined-type MOS transconductor including
a first MOS transistor differential pair with a device size of W/L, a current source value, and a first signal input voltage; and
a plurality of other MOS transistor differential pairs with each pair having the same device size and current source value as the first MOS transistor differential pair and having a second input signal voltage, the second input voltage being half of the first signal input voltage,
wherein the polarity of signal voltages input to the first MOS transistor differential pair and to the plurality of other MOS transistor differential pairs are reversed, such that the current signals of the first pair and the plurality of other transistor differential pairs are subtracted from each other.

17. A current mode D/A converter comprising:
a resistor-type D/A converter circuit having a digital decoder circuit which accepts an n-bit digital input signal wherein n is an integer, a plurality of switches which are turned on and off according to outputs from the digital decoder circuit, and a plurality of series-connected resistors of which respective nodes are connected to each output terminal of the digital decoder circuit through the switches; and
at least one transconductor for receiving voltage output from the resistor-type D/A converter circuit and providing current output, the transconductor including
a first MOS transistor differential pair with a device size of W/L, a current source value, and a first signal input voltage; and
a plurality of other MOS transistor differential pairs with each pair having the same device size and current source value as the first MOS transistor differential pair and having a second input signal voltage, the second input voltage being half of the first signal input voltage,
wherein the polarity of signal voltages input to the first MOS transistor differential pair and to the plurality of other MOS transistor differential pairs are reversed, such that the current signals of the first pair and the plurality of other transistor differential pairs are subtracted from each other.

* * * * *